US012512336B2

(12) United States Patent
Tanoue et al.

(10) Patent No.: US 12,512,336 B2
(45) Date of Patent: Dec. 30, 2025

(54) SUBSTRATE PROCESSING METHOD AND SUBSTRATE PROCESSING APPARATUS

(71) Applicant: Tokyo Electron Limited, Tokyo (JP)

(72) Inventors: Hayato Tanoue, Kumamoto (JP); Yohei Yamashita, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 557 days.

(21) Appl. No.: 17/907,224

(22) PCT Filed: Mar. 2, 2021

(86) PCT No.: PCT/JP2021/007939
§ 371 (c)(1),
(2) Date: Sep. 23, 2022

(87) PCT Pub. No.: WO2021/192853
PCT Pub. Date: Sep. 30, 2021

(65) Prior Publication Data

US 2023/0108557 A1 Apr. 6, 2023

(30) Foreign Application Priority Data

Mar. 24, 2020 (JP) ................................ 2020-053201

(51) Int. Cl.
*H01L 21/67* (2006.01)
*H01L 21/762* (2006.01)

(52) U.S. Cl.
CPC .. *H01L 21/67092* (2013.01); *H01L 21/67115* (2013.01); *H01L 21/76251* (2013.01)

(58) Field of Classification Search
CPC ......... H01L 21/67092; H01L 21/67115; H01L 21/76251; H01L 21/185; H01L 21/30;
(Continued)

(56) References Cited

U.S. PATENT DOCUMENTS 6,846,703 B2 * 1/2005 Shimoda ................ H01L 25/50 257/E21.705
6,887,770 B2 * 5/2005 Ueda ................ H01L 21/76251 438/455
(Continued)

FOREIGN PATENT DOCUMENTS

JP H10125929 A 5/1998
JP H11-026733 A 1/1999
(Continued)

OTHER PUBLICATIONS

International Search Report of PCT/JP2021/007939 dated Apr. 27, 2021.

*Primary Examiner* — Dale E Page
*Assistant Examiner* — Quovaunda Jefferson
(74) *Attorney, Agent, or Firm* — Shih IP Law Group, PLLC.

(57) ABSTRACT

A substrate processing method of a combined substrate in which a first substrate and a second substrate are bonded to each other is provided. A separation facilitating layer and a laser absorption layer are formed on the second substrate in this order. The substrate processing method includes forming a separation modification layer by radiating laser beam to the laser absorption layer while generating a stress in the laser absorption layer; and separating the second substrate from the first substrate along a boundary between the second substrate and the separation facilitating layer.

20 Claims, 11 Drawing Sheets

(58) Field of Classification Search
CPC ............ H01L 21/7806; B23K 26/0006; B23K 26/0622; B23K 26/0823; B23K 26/083; B23K 26/53; B23K 2101/40; B23K 2103/172
See application file for complete search history.

(56) References Cited

U.S. PATENT DOCUMENTS

| | | | |
|---|---|---|---|
| 2021/0296119 | A1 | 9/2021 | Tanque |
| 2021/0327772 | A1 | 10/2021 | Tanoue |

FOREIGN PATENT DOCUMENTS

| | | | | |
|---|---|---|---|---|
| JP | 2002-217390 | A | 8/2002 | |
| JP | 2007-220749 | A | 8/2007 | |
| JP | 2008-177182 | A | 7/2008 | |
| JP | 2018-117060 | A | 7/2018 | |
| WO | WO-2019208298 | A1 * | 10/2019 | ......... B24B 27/0023 |
| WO | 2020017599 | A1 | 1/2020 | |

* cited by examiner

SUBSTRATE PROCESSING METHOD AND SUBSTRATE PROCESSING APPARATUS

CROSS-REFERENCE TO RELATED APPLICATIONS

This Application is a U.S. national phase application under 35 U.S.C. § 371 of PCT Application No. PCT/JP2021/007939 filed on Mar. 2, 2021, which claims the benefit of Japanese Patent Application No. 2020-053201 filed on Mar. 24, 2020, the entire disclosures of which are incorporated herein by reference.

TECHNICAL FIELD

The various aspects and embodiments described herein pertain generally to a substrate processing method and a substrate processing apparatus.

BACKGROUND

Patent Document 1 discloses a manufacturing method for a semiconductor device. This manufacturing method for a semiconductor device includes: a heating process of locally heating a separation oxide film by radiating a $CO_2$ laser from a rear surface of a semiconductor substrate; and a transcribing process of transcribing a semiconductor element to a transcription destination substrate by causing separation in the separation oxide film and/or at an interface between the separation oxide film and the semiconductor substrate.

PRIOR ART DOCUMENT

Patent Document 1: Japanese Patent Laid-open Publication No. 2007-220749

DISCLOSURE OF THE INVENTION

Means for Solving the Problems

In an exemplary embodiment, there is provided a substrate processing method of a combined substrate in which a first substrate and a second substrate are bonded to each other. A separation facilitating layer and a laser absorption layer are formed on the second substrate in this order. The substrate processing method includes forming a separation modification layer by radiating laser beam to the laser absorption layer while generating a stress in the laser absorption layer; and separating the second substrate from the first substrate along a boundary between the second substrate and the separation facilitating layer.

DETAILED DESCRIPTION

Figure 1:
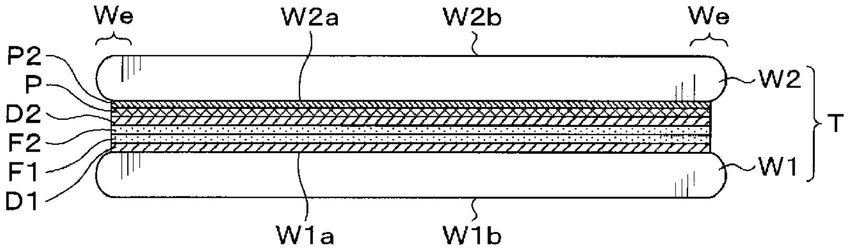
FIG. 1 is a side view illustrating an example of a combined wafer to be processed in a wafer processing system.

In recent years, in a manufacturing process for an LED, there is performed a so-called laser lift-off of separating a gallium nitride (GaN)-based compound crystal layer (material layer) from a sapphire substrate by using a laser beam. As for the background for why the laser lift-off is performed in this way, since the sapphire substrate is transmissive to laser beam (for example, UV light) having a short wavelength, laser beam of a short wavelength having a high absorptance for a laser absorption layer can be used. That is, the laser lift-off is advantageous in that it has a wide range of choices for the laser beam.

Meanwhile, in a manufacturing process for a semiconductor device, there is performed a process of transcribing a device layer formed on a front surface of one substrate (a silicon substrate such as semiconductor) to another substrate. The silicon substrate is generally transmissive to laser beam in a near infrared (NIR) range. Since, however, the laser absorption layer is also transmissive to the NIR laser beam, there is a risk that the device layer may be damaged. Thus, in order to perform the laser lift-off in the manufacturing process for the semiconductor device, laser beam in a far-infrared (FIR) range is used.

In general, the laser beam having the FIR wavelength may be used through, for example, a $CO_2$ laser. In the method described in the aforementioned Patent Document 1, by radiating the $CO_2$ laser to the separation oxide film as the laser absorption layer, separation occurs at an interface between the separation oxide film and the substrate.

However, through intensive research, the present inventors have found out that in the laser lift-off method, the separation of the substrate and the laser absorption layer may not occur properly, that is, the transcription cannot be performed properly in some cases. Specifically, when there is a region within a surface of the laser absorption layer where the bonding strength between the laser absorption layer and the substrate is not reduced as the laser beam is not radiated, there is a risk that the wafer W may be peeled off from the inside in the region which is not radiated with the laser beam, so that a part (silicon piece) of the wafer W may be transcribed, together with the device layer, to the front surface of the laser absorption layer after being subjected to the transcribing processing.

The present disclosure provides a technique enabling to appropriately separate a second substrate from a first substrate in a combined substrate in which the first substrate and the second substrate are bonded to each other. Hereinafter, a wafer processing system as a substrate processing apparatus and a wafer processing method as a substrate processing method according to an exemplary embodiment will be described with reference to the accompanying drawings. Further, in the specification and the drawings, parts having substantially the same functions and configurations will be assigned same reference numerals, and redundant description will be omitted.

As shown in FIG. 1, a combined wafer T as a combined substrate to be processed in a wafer processing according to the present exemplary embodiment is formed by bonding a first wafer W1 as a first substrate and a second wafer W2 as a second substrate to each other. Hereinafter, in the first wafer W1, a surface to be bonded to the second wafer W2 will be referred to as a front surface W1*a*, and a surface opposite to the front surface W1*a* will be referred to as a rear surface W1*b*. Likewise, in the second wafer W2, a surface to be bonded to the first wafer W1 will be referred to as a front surface W2*a*, and a surface opposite to the front surface W2*a* will be referred to as a rear surface W2*b*.

The first wafer W1 is a semiconductor wafer such as, but not limited to, a silicon wafer. A device layer D1 including a plurality of devices is formed on the front surface W1*a* of the first wafer W1. A surface film F1 is formed on the device layer D1, and the device layer D1 is bonded to the second wafer W2 with this surface film F1 therebetween. The surface film F1 may be, by way of non-limiting example, an oxide film (a $SiO_2$ film or a TEOS film), a SiC film, a SiCN film, an adhesive, or the like. Further, the device layer D and the surface film F1 may not be formed on the front surface W1*a*.

The second wafer W2 is also a semiconductor wafer such as, but not limited to, a silicon substrate. On the front surface W2*a* of the second wafer W2, a separation facilitating layer P2, a laser absorption layer P, a device layer D2, and a surface film F2 are stacked in this order from the front surface W2*a* side, and the device layer D2 is bonded to the first wafer W1 with the surface film F2 therebetween. The device layer D2 and the surface film F2 are the same as the device layer D1 and the surface film F1 of the first wafer W1, respectively. Examples of the laser absorption layer P include those capable of absorbing laser beam (for example, a $CO_2$ laser) as will be described later, such as an oxide film (a $SiO_2$ film, a TEOS film) or the like. The separation facilitating layer P2 is formed to ease separation (transcription) of the second wafer W2 from the first wafer W1, and is formed of a material, such as silicon nitride (SiN), whose adhesivity to the second wafer W2 (silicon) is lower than adhesivity to the laser absorption layer P. Further, the separation facilitating layer P2, the laser absorption layer P, the device layer D2, and the surface film F2 may not be formed on the front surface W2*a*. In this case, the separation facilitating layer P2 and the laser absorption layer P are formed on the front surface W1*a* of the first wafer W1 on which the device layer D1 and the surface film F1 are formed, and this device layer D1 is transcribed to the second wafer W2.

A peripheral portion We of the second wafer W2 is chamfered, and the thickness of this peripheral portion We decreases toward a leading end thereof on a cross section thereof. In the manufacturing process for the semiconductor device, the rear surface of the second wafer W2 having the above-described structure may be removed to thin the second wafer W2. In this thinning processing, the peripheral portion We may be given a sharply pointed shape (a so-called knife edge shape). Then, chipping may occur at the peripheral portion We of the second wafer W2, raising a risk that the second wafer W2 may be damaged. To solve the problem, edge trimming of removing the peripheral portion We of the second wafer W2 as will be described later may be performed before the thinning processing. The peripheral portion We is a portion to be removed in this edge trimming, and is in the range of, e.g., 0.5 mm to 3 mm from an edge of the second wafer W2 in a diametrical direction thereof.

In the wafer processing system 1 to be described later according to the present exemplary embodiment, the above-described laser lift-off processing as a wafer processing, that is, the processing of transcribing the device layer D2 to the first wafer W1, or the above-described edge trimming processing as a wafer processing, that is, the processing of removing the peripheral portion We of the second wafer W2 is performed.

Figure 2:
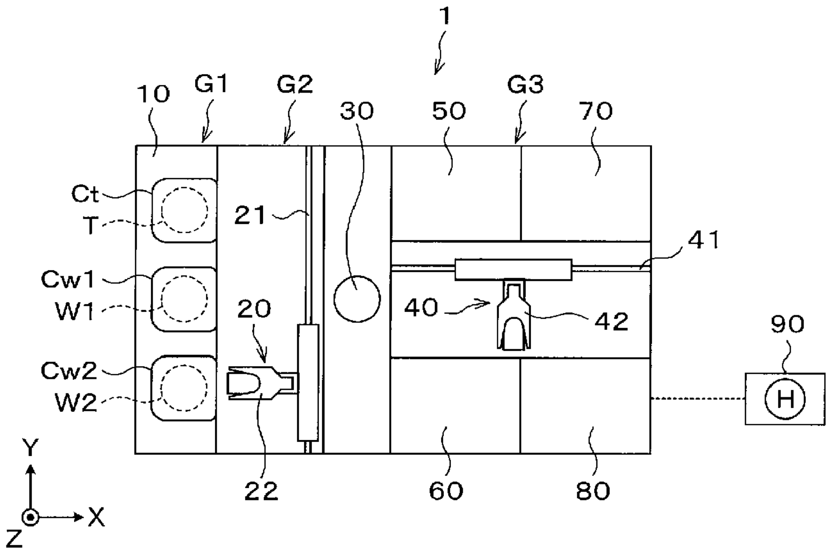
FIG. 2 is a plan view schematically illustrating a configuration of the wafer processing system.

As shown in FIG. 2, the wafer processing system 1 has a configuration in which a carry-in/out block G1, a transfer block G2, and a processing block G3 are connected as one body. The carry-in/out block G1, the transfer block G2, and the processing block G3 are arranged in this order from the negative X-axis side.

In the carry-in/out block G1, cassettes Ct, Cw1, and Cw2 capable of accommodating therein a plurality of combined wafers T, a plurality of first wafers W1, and a plurality of second wafers W2, respectively, are carried to/from, for example, the outside. In the carry-in/out block G1, a cassette placing table 10 is disposed. In the shown example, a plurality of, for example, three cassettes Ct, Cw1, and Cw2 can be arranged on the cassette placing table 10 in a row in the Y-axis direction. Here, the number of the cassettes Ct, Cw1, and Cw2 disposed on the cassette placing table 10 is not limited to the example of the present exemplary embodiment and may be selected as required.

The transfer block G2 is equipped with a wafer transfer device 20 which is disposed adjacent to the cassette placing table 10 on the positive X-axis side of the cassette placing table 10. The wafer transfer device 20 is configured to be movable on a transfer path 21 which is elongated in the Y-axis direction. Further, the wafer transfer device 20 has, for example, two transfer arms 22 configured to hold and transfer the combined wafer T, the first wafer W1, and the second wafer W2. Each transfer arm 22 is configured to be movable in a horizontal direction and a vertical direction and pivotable around a horizontal axis and a vertical axis. In addition, the structure of the transfer arm 22 is not limited to the example of the present exemplary embodiment, and various other structures may be adopted. Moreover, the wafer transfer device 20 is configured to transfer the combined wafer T, the first wafer W1 and the second wafer W2 to/from the cassettes Ct, Cw1 and Cwt on the cassette placing table 10 and a transition device 30 to be described later.

The transfer block G2 is also equipped with, on the positive X-axis side of the wafer transfer device 20, the transition device 30. The transition device 30 is disposed adjacent to the wafer transfer device 20 and configured to deliver the combined substrate T, the first wafer W1, and the second wafer W2.

The processing block G3 has a wafer transfer device 40, a periphery removing apparatus 50, a cleaning apparatus 60, a laser radiation device 70 for inside (hereinafter, referred to as "internal laser radiation device 70"), and a laser radiation device 80 for interface (hereinafter, referred to as "interfacial laser radiation device 80").

The wafer transfer device 40 is configured to be movable on a transfer path 41 which is elongated in the X-axis direction. Further, the wafer transfer device 40 has, for example, two transfer arms 42 configured to hold and transfer the combined wafer T, the first wafer W1, and the second wafer W2. Each transfer arm 42 is configured to be movable in a horizontal direction and a vertical direction and pivotable around a horizontal axis and a vertical axis. In addition, the structure of the transfer arm 42 is not limited to the example of the present exemplary embodiment, and various other structures may be adopted. Further, the wafer transfer device 40 is configured to be capable of transferring the combined wafer T, the first wafer W1 and the second wafer W2 to/from the transition device 30, the periphery removing apparatus 50, the cleaning apparatus 60, the internal laser radiation device 70, and the interfacial laser radiation device 80.

The periphery removing apparatus 50 is provided on the positive Y-axis side of the wafer transfer device 40, and is configured to remove the peripheral portion We of the second wafer W2, that is, perform the edge trimming processing. The cleaning apparatus 60 is provided on the negative Y-axis side of the wafer transfer device 40, and is configured to perform cleaning of the combined wafer T after being subjected to the thinning processing or the removing of the peripheral portion We. The internal laser radiation device 70 as a second laser radiation unit is provided on the positive Y-axis side of the wafer transfer device 40, and radiates laser beam (laser beam for inside, for example, a YAG laser) to an inside of the second wafer W2 to form a peripheral modification layer M2 to be described later, which serves as a starting point for the removal of the peripheral portion We. The interfacial laser radiation device 80 is provided on the negative Y-axis side of the wafer transfer device 40, and radiates laser beam (laser beam for interface, for example, a $CO_2$ laser) to the laser absorption layer P formed on the front surface W2*a* of the second wafer W2. A configuration of the interfacial laser radiation device 80 will be elaborated later.

The above-described wafer processing system 1 is equipped with a control device 90 as a controller. The control device 90 is, for example, a computer, and has a program storage (not shown). A program for controlling a processing of the combined wafer T in the wafer processing system 1 is stored in the program storage. Further, the program storage also stores therein a program for implementing a wafer processing to be described later in the wafer processing system 1 by controlling operations of the above-described various kinds of processing apparatuses and a driving system such as the transfer devices. In addition, the programs may be recorded in a computer-readable recording medium H, and may be installed from this recording medium H to the control device 90.

The wafer processing system 1 is configured as described above. In this wafer processing system 1, the above-described laser lift-off processing for the combined wafer T, that is, the processing of transcribing the device layer D2 to the first wafer W1, and the above-described edge trimming processing for the second wafer W2 can be individually performed. Further, for example, when the edge trimming processing for the second wafer W2 is not performed in the wafer processing system 1, the periphery removing apparatus 50 and the internal laser radiation device 70 may be omitted.

In addition, in the present exemplary embodiment, the separation of the second wafer W2 from the first wafer W1 is performed in the interfacial laser radiation device 80 as will be described later. However, a separating device as a separating unit may be additionally provided in the wafer processing system 1.

Now, the aforementioned interfacial laser radiation device 80 will be explained.

Figure 3:
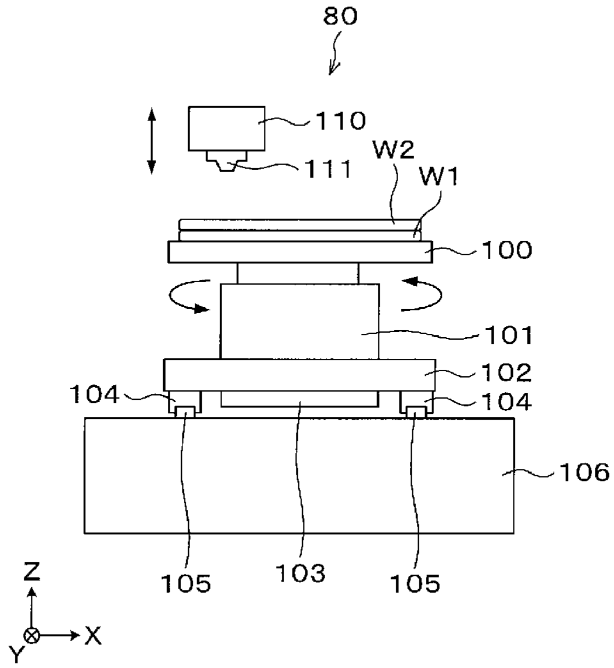
FIG. 3 is a side view illustrating a schematic configuration of an interfacial laser radiation device.
Figure 4:
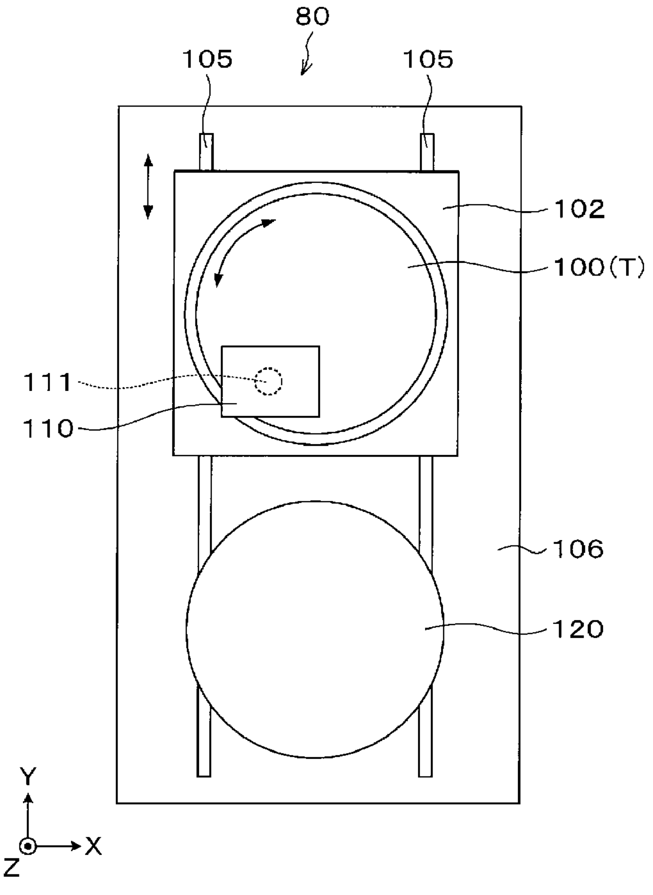
FIG. 4 is a plan view illustrating a schematic configuration of the interfacial laser radiation device.

As illustrated in FIG. 3 and FIG. 4, the interfacial laser radiation device 80 includes a chuck 100 configured to hold the combined wafer T on a top surface thereof. The chuck 100 is configured to attract and hold a part or the whole of the rear surface W1*b* of the first wafer W1. The chuck 100 is provided with a lifting pin (not shown) for delivering the combined wafer T to/from the transfer arm 42. The lifting pin is configured to be movable up and down through a through hole (not shown) formed through the chuck 100, and serves to move the combined wafer T up and down while supporting the combined wafer T from below.

The chuck 100 is supported by a slider table 102 with an air bearing 101 therebetween. A rotating mechanism 103 is provided on a bottom surface of the slider table 102. The rotating mechanism 103 incorporates therein, for example, a motor as a driving source. The chuck 100 is configured to be rotated about a θ axis (vertical axis) by the rotating mechanism 103 via the air bearing 101 therebetween. The slider table 102 is configured to be moved by a moving mechanism 104, which is provided on a bottom surface side thereof, along a rail 105 which is provided on a base 106 and elongated in the Y-axis direction. In addition, though not particularly limited, a driving source of the moving mechanism 104 may be, by way of non-limiting example, a linear motor.

A laser head 110 serving as a laser absorption layer is provided above the chuck 100. The laser head 110 has a lens 111. The lens 111 is a cylindrical member provided on a bottom surface of the laser head 110, and is configured to radiate the laser beam to the combined wafer T held by the chuck 100. In the present exemplary embodiment, the laser beam is $CO_2$ laser beam in a pulse shape, and the laser beam emitted from the laser head 110 is transmitted through the second wafer W2 and is radiated to the laser absorption layer P. The $CO_2$ laser beam has a wavelength ranging from, e.g., 8.9 μm to 11 μm. Further, the laser head 110 is configured to be movable up and down by an elevating mechanism (not shown). In addition, a light source of the laser beam is provided at a distant position outside the laser head 110.

Further, a transfer pad 120 having, on a bottom surface thereof, an attraction surface for attracting and holding the rear surface W2*b* of the second wafer W2 is provided above the chuck 100 as a separating unit. The transfer pad 120 is configured to be movable up and down by an elevating mechanism (not shown). The transfer pad 120 transfers the second wafer W2 between the chuck 100 and the transfer arm 42. Specifically, after the chuck 100 is moved to a position (a transfer position with respect to the transfer arm 42) below the transfer pad 120, the transfer pad 120 is lowered to attract and hold the rear surface W2*b* of the second wafer W2. Then, the transfer pad 120 is raised again to separate the second wafer W2 from the first wafer W1. The separated second wafer W2 is transferred from the transfer pad 120 to the transfer arm 42, and is carried out from the interfacial laser radiation device 80. Further, the transfer pad 120 may be configured to turn a front surface and a rear surfaces of a wafer upside down by an inverting mechanism (not shown).

Now, a wafer processing performed by using the wafer processing system 1 having the above-described configuration will be discussed. The following description will be provided for a case where a laser lift-off processing is performed in the wafer processing system 1, that is, a case where the device layer D2 of the second wafer W2 is transcribed to the first wafer W1. Further, in the present exemplary embodiment, the first wafer W1 and the second wafer W2 are bonded in a bonding apparatus (not shown) outside the wafer processing system 1 to prepare the combined wafer T in advance.

First, the cassette Ct accommodating therein the plurality of combined wafers T is placed on the cassette placing table 10 of the carry-in/out block G1. Then, the combined wafer T in the cassette Ct is taken out by the wafer transfer device 20. The combined wafer T taken out from the cassette Ct is transferred to the wafer transfer device 40 via the transition device 30, and then transferred to the interfacial laser radiation device 80. In the interfacial laser radiation device 80, the second wafer W2 is separated from the first wafer W1 (subjected to the laser lift-off processing).

Specifically, the combined wafer T attracted to and held by the chuck 100 from the transfer arm 42 via the lifting pin is first moved to a processing position by the moving mechanism 104. This processing position is a position where laser beam can be radiated from the laser head 110 to the combined wafer T (laser absorption layer P).

Figure 5:
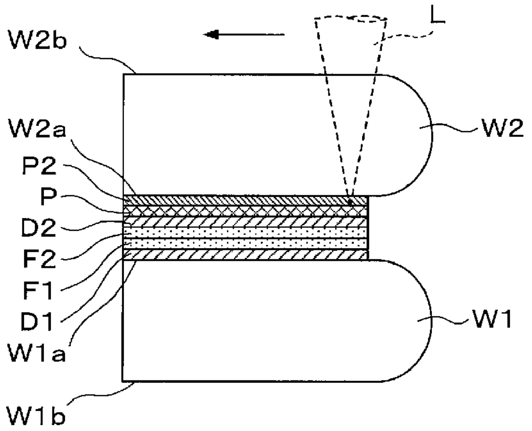
FIG. 5 is an explanatory diagram illustrating a state in which a separation modification layer according to an exemplary embodiment is being formed.
Figure 6:
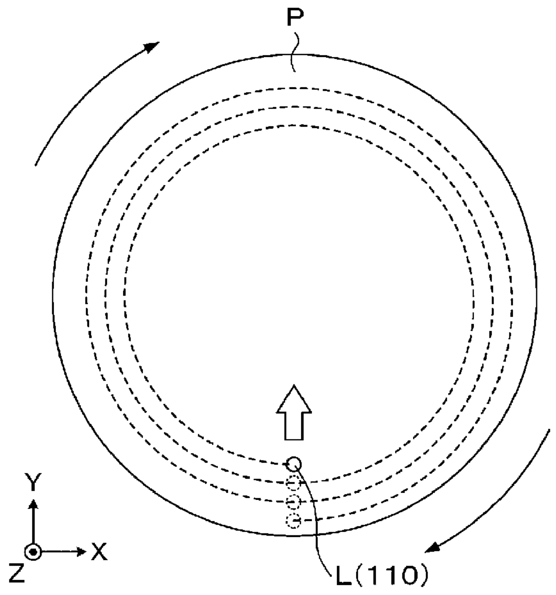
FIG. 6 is a plan view illustrating an example of forming the separation modification layer according to the exemplary embodiment.
Figure 7A:
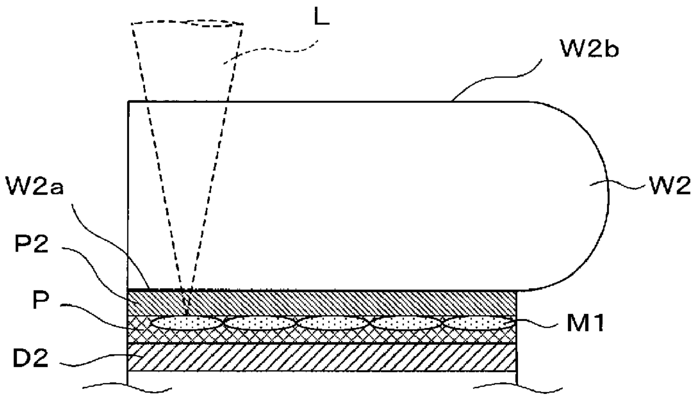
FIG. 7A and FIG. 7B are explanatory diagrams illustrating a gas flow within the combined substrate in a wafer processing according to the exemplary embodiment.

Subsequently, as shown in FIG. 5 and FIG. 6, laser beam L ($CO_2$ laser beam) is radiated in a pulse shape from the laser head 110 toward the rear surface W2*b* of the second wafer W2. At this time, the laser beam L penetrates the second wafer W2 and the separation facilitating layer P2 from the rear surface W2*b* side of the second wafer W2, and is absorbed by the laser absorption layer P. A stress is generated inside the laser absorption layer P that has absorbed the laser beam L, as illustrated in FIG. 7A. Hereinafter, a stress accumulation layer which is formed as a result of the generation as a result of the radiation of the laser beam and which is to serve as a starting point for the separation of the second wafer W2 (a starting point for the transcription of the device layer D2) will sometimes be referred to as "separation modification layer M1". Further, almost all the energy of the laser beam L radiated to the laser absorption layer P is absorbed through the formation of the separation modification layer M1, and does not reach the device layer D2. Therefore, damage to the device layer D2 can be suppressed.

Here, the laser beam L radiated to the laser absorption layer P is controlled to have an output that does not cause the separation facilitating layer P2 and the laser absorption layer P to be separated by the stress generated by the radiation of the laser beam L.

In this way, by suppressing an escape of the generated stress without causing the separation of the separation facilitating layer P2 and the laser absorption layer P by the radiation with the laser beam L, the stress is accumulated inside the laser absorption layer P, so that the separation modification layer M1 is formed. As a specific example, by gasifying the laser absorption layer P through the radiation of the laser beam and suppressing the escape of the generated gas as described above, a compressive stress is accumulated as the separation modification layer M1. As an example, heat is generated in the laser absorption layer P by the absorption of the laser beam, and a shear stress is accumulated as the separation modification layer M1 due to a difference in thermal expansion coefficients of the separation facilitating layer P2 and the laser absorption layer P.

Figure 7B:
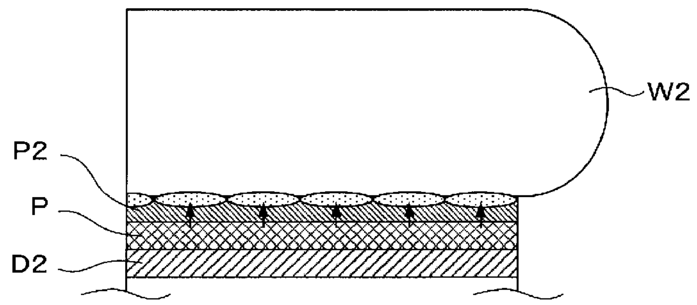

The stress generated by the radiation of the laser beam L usually stays at the position (the inside of the laser absorption layer P) to which the laser beam L is radiated as described above, and forms the separation modification layer M1. However, in the present exemplary embodiment, the separation facilitating layer P2 is formed between the front surface W2*a* of the second wafer W2 and the laser absorption layer P, and the adhesivity between the separation facilitating layer P2 and the second wafer W2 is weaker than the adhesivity between the separation facilitating layer P2 and the laser absorption layer P. For this reason, as shown in FIG. 7B, the stress generated in the laser absorption layer P is transmitted through the separation facilitating layer P2 to be accumulated at the interface between the separation facilitating layer P2 and the second wafer W2. That is to say, the stress generated as a result of radiating the laser beam L is moved to the interface between the separation facilitating layer P2 and the second wafer W2 where it can stay more stably, and is then accumulated thereat. If the stress is accumulated at the interface between the separation facilitating layer P2 and the second wafer W2 in this way, the bonding strength between the separation facilitating layer P2 and the second wafer W2 is reduced.

In the present exemplary embodiment, the radiation of the laser beam L to the laser absorption layer P, that is, the separation of the separation facilitating layer P2 and the second wafer W2 is performed in the entire surface of the laser absorption layer P, when viewed form the top. Specifically, when radiating the laser beam L to the laser absorption layer P, the chuck 100 (combined wafer T) is rotated by the rotating mechanism 103, and the chuck 100 (combined wafer T) is moved in the Y-axis direction by the moving mechanism 104. Accordingly, the laser beam L is radiated to the laser absorption layer P from, for example, a diametrically outer side toward a diametrically inner side thereof, and, as a result, the laser beam L is radiated to the entire surface of the laser absorption layer P in a spiral shape from the outer side toward the inner side. Further, black-colored arrows shown in FIG. 6 indicate a rotation direction of the chuck 100. Further, the formation of the separation modification layer M1 may be performed in a direction from the diametrically inner side toward the diametrically outer side.

Here, the formation interval of the neighboring separation modification layers M1, that is, a pulse interval (frequency) of the laser beam L is controlled to be an interval at which separation does not occur between the neighboring separation modification layers M1 due to an impact generated when those separation modification layers M1 are formed. As an example, it is desirable that the neighboring separation modification layers M1 are formed so as not to overlap each other when viewed from the top. Furthermore, at this time, it is desirable that the neighboring separation modification layers M1 are formed adjacent to each other.

Figure 8:
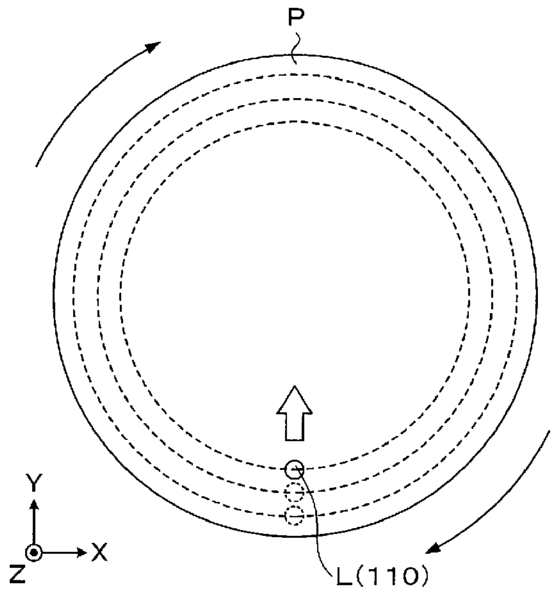
FIG. 8 is a plan view illustrating another example of forming the separation modification layer according to the exemplary embodiment.

Further, as shown in FIG. 8, in the laser absorption layer P, the laser beam L may be annularly radiated in concentric circles. In this case, however, since the rotation of the chuck 100 and the movement of the chuck 100 in the Y direction are alternately performed, it may be more desirable to radiate the laser beam L in the spiral shape as described above as it reduces the radiation time and thus improve throughput.

In addition, in the present exemplary embodiment, the chuck 100 is rotated when radiating the laser beam L to the laser absorption layer P. However, it may be possible to move the laser head 110 instead, thus allowing the laser head 110 to be rotated relative to the chuck 100. Further, although the chuck 100 is moved in the Y-axis direction, the laser head 110 may be moved in the Y-axis direction.

Figure 9A:
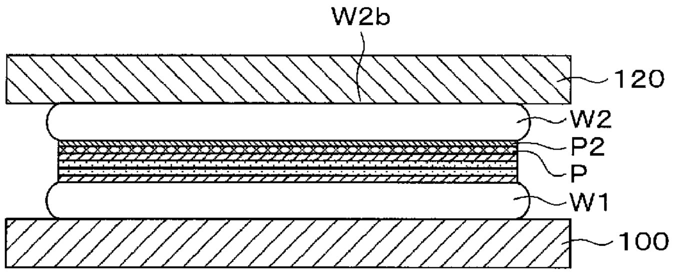
FIG. 9A and FIG. 9B are explanatory diagrams illustrating separation of a second wafer according to the exemplary embodiment.
Figure 9B:
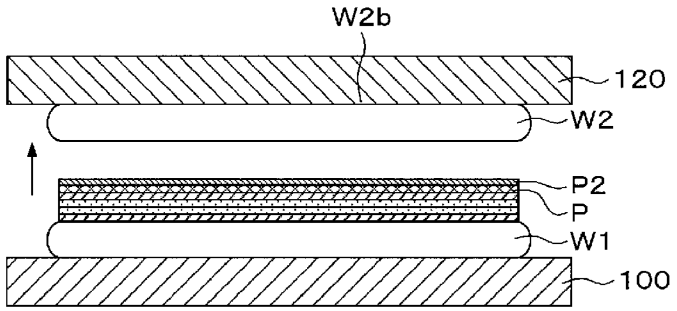

If the laser beam L is radiated to the entire surface of the laser absorption layer P, the chuck 100 is then moved to a delivery position below the transfer pad 120 by the moving mechanism 104. At the delivery position, the rear surface W2*b* of the second wafer W2 is attracted to and held by the transfer pad 120, as shown in FIG. 9A. Then, by raising the transfer pad 120 as shown in FIG. 9B, the second wafer W2 is separated from the separation facilitating layer P2 (the first wafer W1). Accordingly, the device layer D2 formed on the front surface of the second wafer W2 is transcribed to the first wafer W1. At this time, since the stress generated by the radiation of the laser beam is accumulated at the interface between the separation facilitating layer P2 and the second wafer W2 as described above, the bonding strength therebetween is reduced. Therefore, the second wafer W2 can be separated from the separation facilitating layer P2 without needing to apply a large load.

At this time, although the separation modification layers M1 are formed so as not to overlap with each other as stated above, the stress accumulated by the formation of the separation modification layers M1 is released to the outside when the separation of the second wafer W2 and the separation facilitating layer P2 takes place at the position where the separation modification layers M1 are formed. In the present exemplary embodiment, since the separation modification layers M1 are formed adjacent to each other as described above, the stress is released in a chain manner when the separation has occurred at the positions where the neighboring separation modification layers M1 are formed, that is, when the stress is released to the outside at the neighboring positions. That is, if a part of the interface between the separation facilitating layer P2 and the second wafer W2 is separated as a result of raising the transfer pad 120, the entire surface of the second wafer W2 is separated in a chain manner, starting from this separation position. That is, the second wafer W2 can be more appropriately separated from the separation facilitating layer P2 without applying a large load.

However, there may be formed a region (non-separation region) in which the separation of the separation facilitating layer P2 and the second wafer W2 does not occur because the laser beam L is not radiated to the laser absorption layer P due to a relationship between a frequency of the laser beam L and a rotation speed of the chuck 100, etc. However, according to the present exemplary embodiment, since the separation facilitating layer P2 is formed of a material having low adhesivity to the second wafer W2 (silicon), even in case that the non-separation region is formed in this way, the separation facilitating layer P2 and the second wafer W2 can be easily separated. Since the separation facilitating layer P2 and the second wafer W2 are properly separated in this way, it is possible to appropriately suppress a part (silicon piece) of the second wafer W2 from being transcribed to the surface of the separation facilitating layer P2 after the second wafer W2 is separated. Therefore, the damage to the second wafer W2 after being separated can be suppressed.

In this way, when the separation at the interface between the separation facilitating layer P2 and the second wafer W2 is properly performed in this way, the stress generated by the radiation of the laser beam needs to be transmitted through the separation facilitating layer P2. Specifically, when the laser absorption layer P is gasified, for example, it is necessary for the generated gas to pass through the separation facilitating layer P2. Further, when the separation of the separation facilitating layer P2 and the second wafer W2 is performed due to the difference in their thermal expansion coefficients, the heat generated by the radiation of the laser beam needs to be appropriately transferred to the interface between the separation facilitating layer P2 and the second wafer W2. However, when the separation facilitating layer P2 has a large thickness, the generated stress may not be properly transmitted through the separation facilitating layer P2 but remain at the interface between the separation facilitating layer P2 and the laser absorption layer P. In view of this, in order to properly perform the separation at the interface between the separation facilitating layer P2 and the second wafer W2, it is desirable that the thickness of the separation facilitating layer P2 is smaller than that of the laser absorption layer P, specifically, about 1/10 of the film thickness of the laser absorption layer P, for example. By setting the film thickness of the separation facilitating layer P2 to be small in this way, the generated stress can be properly transmitted through the separation facilitating layer P2 to reduce the bonding strength between the second wafer W2 and the separation facilitating layer P2. That is, the second wafer W2 can be appropriately separated from the separation facilitating layer P2.

However, even when the film thickness of the separation facilitating layer P2 is large so the generated stress is not properly transmitted through the separation facilitating layer P2 but remains at the interface between the separation facilitating layer P2 and the laser absorption layer P, the separation facilitating layer P2 may act as a protective film for the second wafer W2. That is, it is possible to appropriately suppress the transcription of the silicon piece, together with the device layer D2, to the interface after being separated by the second wafer W2 being peeled off from the inside.

Figure 10:
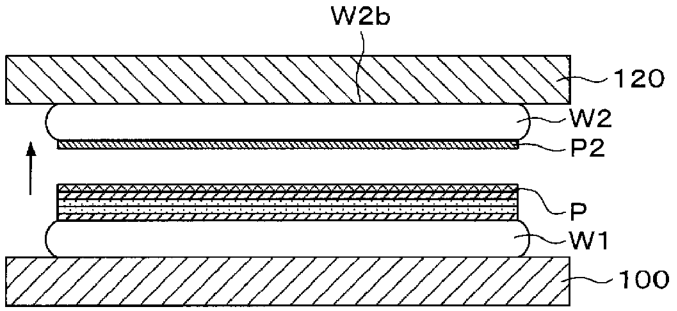
FIG. 10 is an explanatory diagram illustrating the separation of the second wafer according to the exemplary embodiment.

Specifically, when the separation modification layer M1 is formed by the stress generated at the interface between the separation facilitating layer P2 and the laser absorption layer P and the stress remains at the interface, the second wafer W2 is separated from the first wafer W1 with the separation facilitating layer P2 and the laser absorption layer P as a boundary, as illustrated in FIG. 10. At this time, since the second wafer W2 is separated from the laser absorption layer P with the separation facilitating layer P2 therebetween, the second wafer W2 is not left at the separation interface. Accordingly, the front surface W2*a* of the second wafer W2 can be protected, and damage to the separation surface can be suppressed.

The second wafer W2 separated from the first wafer W1 is delivered from the transfer pad 120 to the transfer arm 42 of the wafer transfer device 40, and is then transferred to the cassette Cw2 of the cassette placing table 10. Further, the front surface W2*a* of the second wafer W2 carried out from the interfacial laser radiation device 80 may be cleaned in the cleaning apparatus 60 before being transferred to the cassette Cw2.

Meanwhile, the first wafer W1 held by the chuck 100 is delivered to the transfer arm 42 of the wafer transfer device 40 via the lifting pin, and is then transferred to the cleaning apparatus 60. In the cleaning apparatus 60, the surface of the separation facilitating layer P2 which is the separation surface is scrub-cleaned. In addition, in the cleaning apparatus 60, the rear surface W1*b* of the first wafer W1 may be cleaned together with the surface of the separation facilitating layer P2.

Thereafter, the first wafer W1 after being subjected to all the processes related to the transcription of the device layer D2 to the first wafer W1 is transferred to the cassette Cw1 of the cassette placing table 10 by the wafer transfer device 20 via the transition device 30. Thus, the series of processes of the wafer processing in the wafer processing system 1 are ended.

According to the above-described exemplary embodiment, since the separation facilitating layer P2 is formed between the second wafer W2 and the laser absorption layer P, the separation of the second wafer W2 from the first wafer W1, that is, transcription of the device layer D2 can be carried out appropriately. Specifically, the stress generated in the laser absorption layer P by the radiation of the laser beam is moved to the interface between the second wafer W2 and the separation facilitating layer P2. As a result, since the bonding strength between the second wafer W2 and the separation facilitating layer P2 is reduced at the interface therebetween, the second wafer W2 and the separation facilitating layer P2 can be separated appropriately. Here, since the separation facilitating layer P2 is formed of the material (for example, SiN) having low adhesivity to the second wafer W2, the separation of the second wafer W2 from the separation facilitating layer P2 can be carried out more appropriately.

Further, in the above-described exemplary embodiment, a material having low adhesivity to the second wafer W2 (silicon) is used as the separation facilitating layer P2. However, the material used for the separation facilitating layer P2 is not limited thereto, and a material having a thermal expansion coefficient different from that of the second wafer W2 (silicon) may be used, for example. In this case, the deformation amount caused by the heat generated by the radiation of the laser beam L to the laser absorption layer P is different between the second wafer W2 and the separation facilitating layer P2, whereby a shear force is generated at the interface between the second wafer W2 and the separation facilitating layer P2, so that the second wafer W2 and the separation facilitating layer P2 can be separated. In particular, when the shear stress is generated to be accumulated at the interface between the second wafer W2 and the separation facilitating layer P2 as the separation modification layer M1 as described above, the second wafer W2 and the separation facilitating layer P2 can be separated more appropriately by using the materials having different thermal expansion coefficients.

In addition, in the above-described exemplary embodiment, although the second wafer W2 is separated from the separation facilitating layer P2 by the radiation of the laser beam L, bending of the combined wafer T may be caused in the separation of the second wafer W2. When the combined wafer T is bent in this way, there exists a likelihood that the wafer processing in the wafer processing system 1 may not be performed properly. In this regard, in order to suppress the bending of the combined wafer T, the combined wafer T may be pressed from above when the laser beam L is radiated to the laser absorption layer P.

Figure 11A:
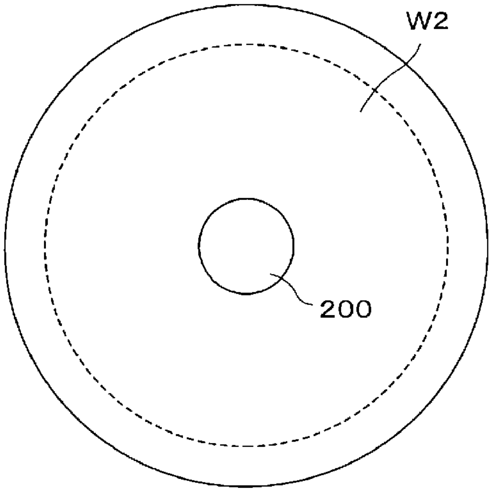
FIG. 11A and FIG. 11B are explanatory diagrams illustrating an operation of pressing the second wafer.
Figure 11B:
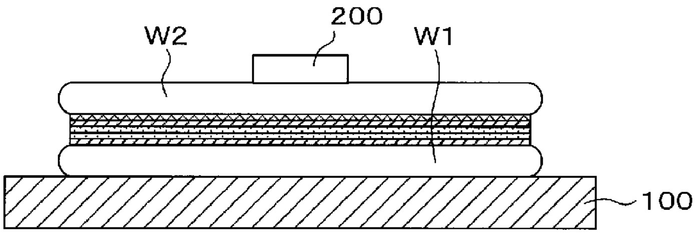

By way of example, when the combined wafer T is bent to be deformed into an upwardly convex shape, a central portion of the combined wafer T may be pressed by a pressing member 200 as shown in FIG. 11A and FIG. 11B. To elaborate, in the separation of the second wafer W2, the separation modification layer M1 is previously formed at a center portion of the laser absorption layer P which is within a pressing range by the pressing member 200. The formation direction thereof with respect to the diametrical direction of the separation modification layer M1 is not specifically limited. Once the separation modification layer M1 is formed at the central portion of the laser absorption layer P, the central portion of the combined wafer T on which the separation modification layer M1 is formed is pressed by the pressing member 200. Then, with the central portion of the combined wafer T pressed by the pressing member 200, the separation modification layer M1 is formed at an outer peripheral portion of the laser absorption layer P, and, then, the second wafer W2 is separated. At this time, since the central portion of the combined wafer T is pressed by the pressing member 200, the bending of the combined wafer T is suppressed in the formation of the separation modification layer M1 at the outer peripheral portion of the laser absorption layer P and in the separation of the second wafer W2.

Further, since the combined wafer T is rotated during the radiation of the laser beam L, it is desirable that an end of the pressing member 200 is configured to be rotated together with the combined wafer T.

Figure 12A:
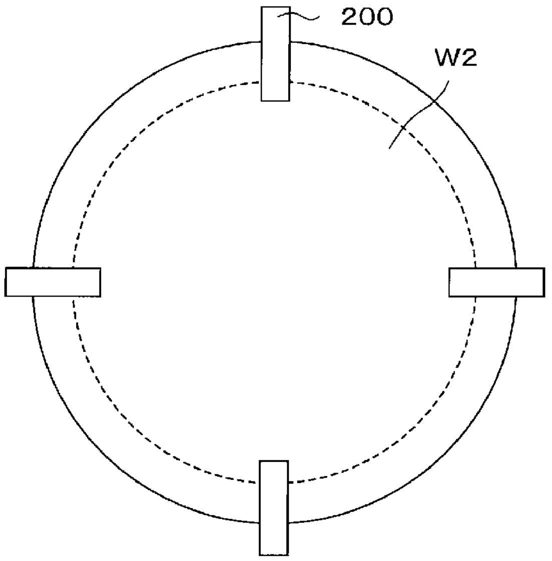
FIG. 12A and FIG. 12B are explanatory diagrams illustrating an operation of pressing the second wafer.
Figure 12B:
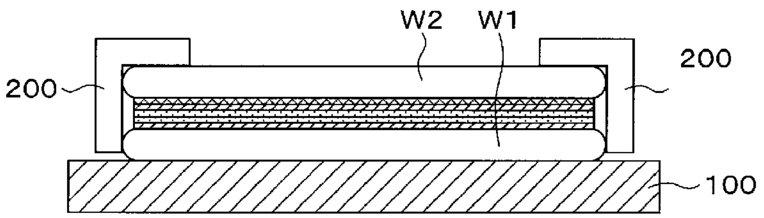

Further, when the combined wafer T is bent to be deformed into, for example, a downwardly convex shape, the peripheral portion We of the combined wafer T may be pressed by the pressing member 200 as shown in FIG. 12A and FIG. 12B. To elaborate, in the separation of the second wafer W2, the separation modification layer M1 is previously formed at the outer peripheral portion of the laser absorption layer P which is within the pressing range by the pressing member 200. Once the separation modification layer M1 is formed at the outer peripheral portion of the laser absorption layer P, the outer peripheral portion of the combined wafer T on which the separation modification layer M1 is formed is pressed by the pressing member 200. Then, with the outer peripheral portion of the combined wafer T pressed by the pressing member 200, the separation modification layer M1 is formed at the central portion of the laser absorption layer P, and, thereafter, the second wafer W2 is separated. At this time, since the outer peripheral portion of the combined wafer T is pressed by the pressing member 200, the bending of the combined wafer T can be suppressed in the formation of the separation modification layer M1 at the central portion of the laser absorption layer P and in the separation of the second wafer W2.

Figure 13:
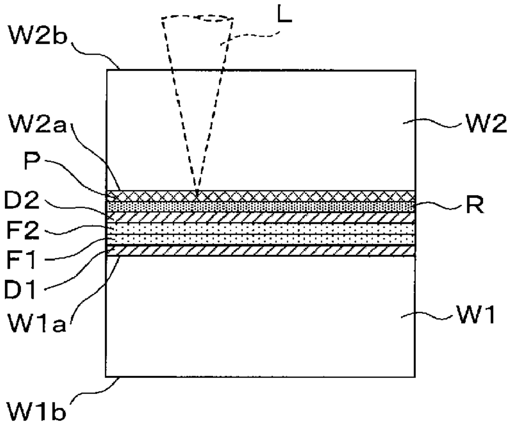
FIG. 13 is a side view schematically illustrating a structure of a combined wafer according to another exemplary embodiment.

Moreover, in the combined wafer T processed in the above-described exemplary embodiment, a reflection film R may be provided between the laser absorption layer P and the device layer D2 as shown in FIG. 13. That is, the reflection film R is formed on the surface of the laser absorption layer P opposite to the surface on which the laser beam L is incident. For the reflection film R, a material having a high reflectance with respect to the laser beam L and a high melting point, for example, a metal film is used. In addition, the device layer D2 is a layer which has a function, and is different from the reflection film R.

In this case, the laser beam L emitted from the laser head 110 is transmitted through the second wafer W2 and is almost completely absorbed in the laser absorption layer P. Even if the laser beam L cannot be fully absorbed, it is reflected by the reflection film R. As a result, the laser beam L does not reach the device layer D2, and the damage to the device layer D2 can be securely suppressed.

Further, the laser beam L reflected by the reflection film R is absorbed by the laser absorption layer P. Accordingly, the separation efficiency of the second wafer W2 may be improved.

In addition, although the above exemplary embodiment has been described for the case where the laser lift-off processing for the combined wafer T, that is, the processing of transcribing the device layer D2 to the first wafer W1 is performed in the wafer processing system 1, the edge trimming processing of the second wafer W2 can be performed in the wafer processing system 1 as mentioned above. Hereinafter, the case where the edge trimming of the second wafer W2 in the wafer processing system 1 is performed will be explained.

First, the combined wafer T is taken out by the wafer transfer device 20 from the cassette Ct disposed on the cassette placing table 10 of the carry-in/out block G1, and the taken combined wafer T is transferred to the wafer transfer device 40 through the transition device 30. Thereafter, it is transferred to the internal laser radiation device 70.

Figure 14A:
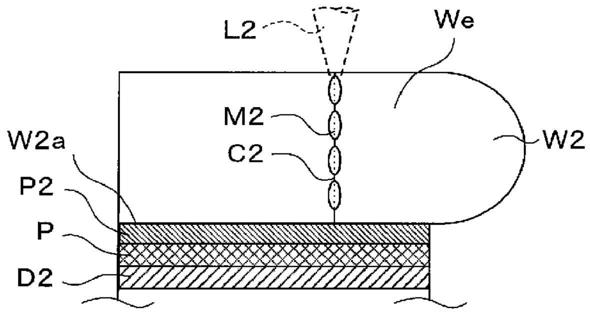
FIG. 14A to FIG. 14D are explanatory diagrams illustrating a sequence of an edge trimming processing according to the exemplary embodiment.

In the internal laser radiation device 70, laser beam L2 (YAG laser beam) is radiated to an inside of the second wafer W2 as shown in FIG. 14A to form a peripheral modification layer M2 to be used as a starting point when removing the peripheral portion We in the edge trimming to be described later. A crack C2 develops from the peripheral modification layer M2 in a thickness direction of the second wafer W2. An upper end and a lower end of the crack C2 reach, for example, the rear surface W2*b* and the front surface W2*a* of the second wafer W2, respectively. The combined wafer T in which the peripheral modification layer M2 is formed inside the second wafer W2 is then transferred to the interfacial laser radiation device 80 by the wafer transfer device 40.

Figure 14B:
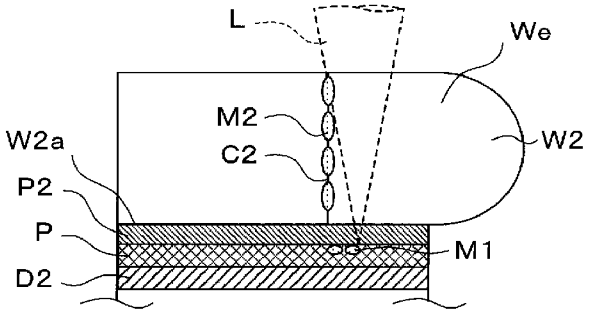
Figure 14C:
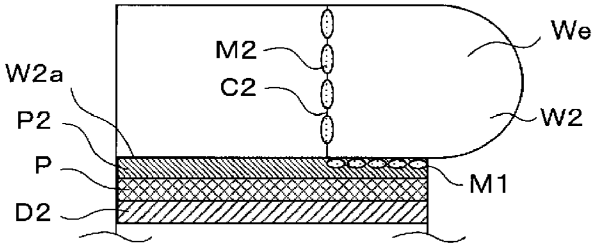

In the interfacial laser radiation device 80, the bonding strength between the separation facilitating layer P2 and the second wafer W2 at the peripheral portion We as a removing target portion of the second wafer W2 is reduced in the combined wafer T. To be specific, the laser beam L ($CO_2$ laser) is radiated to the laser absorption layer P as shown in FIG. 14B, and the stress is generated inside the laser absorption layer P at a diametrically outer side than the peripheral modification layer M2 formed by the internal laser radiation device 70. Further, the generated stress is transmitted through the separation facilitating layer P2 as shown in FIG. 14C, whereby the stress is accumulated at the boundary between the second wafer W2 and the separation facilitating layer P2.

The combined wafer T, in which the separation modification layer M1 is formed on the entire surface of the peripheral portion We and the bonding strength between the separation facilitating layer P2 and the second wafer W2 is reduced, is then transferred to the periphery removing apparatus 50 by the wafer transfer device 40.

Figure 14D:
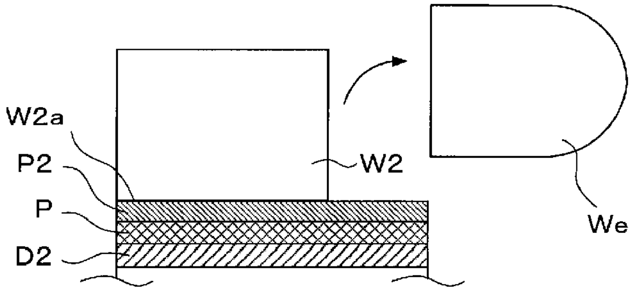

In the periphery removing apparatus 50, the peripheral portion We of the second wafer W2 is removed from the combined wafer T starting from the peripheral modification layer M2 and the crack C2 (edge trimming), as illustrated in FIG. 14D. Here, the way to perform the edge trimming in the periphery removing apparatus 50 may be selected as required. In removing the peripheral portion We, since the bonding strength between the second wafer W2 and the separation facilitating layer P2 is lowered due to the formation of the separation modification layer M1, the removal of the peripheral portion We can be carried out easily.

The combined wafer T from which the peripheral portion We of the second wafer W2 has been removed is then transferred to the cleaning apparatus 60 by the wafer transfer device 40. In the cleaning apparatus 60, scrub cleaning of the combined wafer T is performed. Thereafter, the combined wafer T after being subjected to all the required processes is taken out from the cleaning apparatus 60 by the wafer transfer device 40, and transferred to the cassette Ct on the cassette placing table 10 by the wafer transfer device 20 via the transition device 30. In this way, the series of processes of the wafer processing in the wafer processing system 1 are ended.

As described above, according to the technique of the present disclosure, the bonding strength between the second wafer W2 and the separation facilitating layer P2 at the peripheral portion We can be reduced by the interfacial laser radiation device 80, which makes it possible to appropriately perform the removal of the peripheral portion We, that is, the edge trimming in the periphery removing apparatus 50.

Additionally, the processing sequence of the combined wafer T by the internal laser radiation device 70 and the interfacial laser radiation device 80 is not limited to the example of the above-described exemplary embodiment. After the separation of the peripheral portion We is performed in the interfacial laser radiation device 80, the peripheral modification layer M2 may be formed in the internal laser radiation device 70.

It should be noted that the above-described exemplary embodiment is illustrative in all aspects and is not anyway limiting. The above-described exemplary embodiment may be omitted, replaced and modified in various ways without departing from the scope and the spirit of claims.

According to the exemplary embodiment, it is possible to appropriately separate the second substrate from the first substrate in the combined substrate in which the first substrate and the second substrate are bonded to each other.

We claim:

1. A substrate processing method of a combined substrate in which a first substrate and a second substrate are bonded to each other, wherein a separation facilitating layer and a laser absorption layer are formed on the second substrate in this order, and wherein the substrate processing method comprises:

forming a separation modification layer by radiating laser beam from a side of the second substrate to the laser absorption layer while accumulating a stress at a boundary between the second substrate and the separation facilitating layer; and separating the second substrate from the first substrate along the boundary between the second substrate and the separation facilitating layer.

2. The substrate processing method of claim 1, wherein the separation facilitating layer has a thickness smaller than that of the laser absorption layer.

3. The substrate processing method of claim 2, wherein the thickness of the separation facilitating layer equals to 1/10 of the thickness of the laser absorption layer.

4. The substrate processing method of claim 1, wherein, in the forming of the separation modification layer, the stress is generated in the laser absorption layer, is transmitted through the separation facilitating layer, and is accumulated at the boundary between the second substrate and the separation facilitating layer to thereby reduce a bonding strength between the separation facilitating layer and the second substrate.

5. The substrate processing method of claim 1, wherein the separation facilitating layer is formed of a material whose adhesivity to the second substrate is smaller than adhesivity to the laser absorption layer.

6. The substrate processing method of claim 1, wherein the separation facilitating layer is formed of a material having a thermal expansion coefficient different from that of the second substrate.

7. The substrate processing method of claim 5, wherein the material of the separation facilitating layer is SiN.

8. The substrate processing method of claim 1, wherein the separating of the second substrate is performed by releasing the stress accumulated in the laser absorption layer in a chain manner.

9. The substrate processing method of claim 1, further comprising:

forming a peripheral modification layer along a boundary between a peripheral portion of the second substrate as a removing target and a central portion of the second substrate, wherein the separation modification layer is formed at a diametrically outer side than the peripheral modification layer.

10. The substrate processing method of claim 1, wherein, in the laser absorption layer, a reflection film is formed on a surface opposite to a surface on which the laser beam is incident, in the laser beam radiated to the laser absorption layer, the laser beam which is not absorbed by the laser absorption layer is reflected by the reflection film, and the laser beam reflected by the reflection film is absorbed by the laser absorption layer.

11. A substrate processing apparatus configured to process a combined substrate in which a first substrate and a second substrate are bonded to each other, a separation facilitating layer and a laser absorption layer being stacked on the second substrate in this order, the substrate processing apparatus comprising:

a laser radiation unit configured to radiate laser beam to the laser absorption layer;

a separating unit configured to separate the second substrate from the first substrate; and a controller configured to control operations of the laser radiation unit and the separating unit, wherein the controller controls the operation of the laser radiation unit such that after forming a separation modification layer by radiating the laser beam from a side of the second substrate and accumulating a stress at a boundary between the second substrate and the separation facilitating layer, the second substrate is allowed to be separated from the first substrate along the boundary between the second substrate and the separation facilitating layer.

12. The substrate processing apparatus of claim 11, wherein the separation facilitating layer has a thickness smaller than that of the laser absorption layer.

13. The substrate processing apparatus of claim 12, wherein the thickness of the separation facilitating layer equals to 1/10 of the thickness of the laser absorption layer.

14. The substrate processing apparatus of claim 11, wherein the controller controls the operation of the laser radiation unit such that the stress is generated by modifying the laser absorption layer, is transmitted through the separation facilitating layer, and is accumulated at the boundary between the second substrate and the separation facilitating layer to reduce a bonding strength between the separation facilitating layer and the second substrate.

15. The substrate processing apparatus of claim 11, wherein the separation facilitating layer is formed of a material whose adhesivity to the second substrate is smaller than adhesivity to the laser absorption layer.

16. The substrate processing apparatus of claim 11, wherein the separation facilitating layer is formed of a material having a thermal expansion coefficient different from that of the second substrate.

17. The substrate processing apparatus of claim 15, wherein the material of the separation facilitating layer is SiN.

18. The substrate processing apparatus of claim 11, wherein the controller controls the operations of the laser radiation unit and the separating unit such that the second substrate is allowed to be separated by releasing the stress accumulated in the laser absorption layer in a chain manner.

19. The substrate processing apparatus of claim 11, further comprising:

a second laser radiation unit configured to form a peripheral modification layer along a boundary between a peripheral portion of the second substrate and a central portion of the second substrate, wherein the controller controls the operation of the laser radiation unit such that the separation modification layer is formed at a diametrically outer side than the peripheral modification layer.

20. The substrate processing apparatus of claim 11, wherein, in the laser absorption layer, a reflection film is formed on a surface opposite to a surface on which the laser beam is incident.

* * * * *